United States Patent [19]

Kemp, Jr. et al.

[11] Patent Number: 4,880,170

[45] Date of Patent: Nov. 14, 1989

[54] PROCESS FOR PRODUCING FINE COPPER POWDER WITH ENHANCED SINTERABILITY

[75] Inventors: Preston B. Kemp, Jr., Troy, N.Y.; Walter A. Johnson, Houghton, Mich.

[73] Assignee: GTE Products Corporation, Stamford, Conn.

[21] Appl. No.: 292,791

[22] Filed: Jan. 3, 1989

[51] Int. Cl.$^4$ ............................................. B02C 19/06
[52] U.S. Cl. ....................................................... 241/5
[58] Field of Search ............................... 241/5, 39, 40; 75/0.5 R, 0.5 C

[56] References Cited

U.S. PATENT DOCUMENTS

| | | |
|---|---|---|
| 3,186,648 | 6/1965 | Mandle et al. ...................... 241/5 X |
| 3,614,000 | 10/1971 | Blythe ...................................... 241/5 |
| 4,171,410 | 10/1979 | Fröb ................................. 264/321 X |
| 4,290,195 | 9/1981 | Rippere ................................. 29/837 |

*Primary Examiner*—Timothy V. Eley

[57] ABSTRACT

Copper powder with enhanced sinterability and process for producing same is disclosed which comprises fluid energy milling dendritic copper powder particles having a mean particle size of no greater than about 25 micrometers in diameter to produce a deagglomerated cold-worked powder wherein the particles are essentially equiaxed in shape and are of a mean particle size of no greater than about 7 micrometers in diameter.

2 Claims, No Drawings

PROCESS FOR PRODUCING FINE COPPER POWDER WITH ENHANCED SINTERABILITY

This invention is related to application No. 07/292788 entitled "Process For Producing Fine Copper Flakes", and No. 07/292790 entitled "Low Oxygen Content Fine Spherical Copper Particles And Process For Producing Same By Fluid Energy Milling And High Temperature Processing", both assigned to the same assignee as the present application and both filed concurrently herewith.

BACKGROUND OF THE INVENTION

This invention relates to a process for producing fine copper powder with enhanced sinterability. More particularly, the proces involves fluid energy milling dendritic copper powder to produce cold-worked powders. The particle size is reduced and the copper particles are equiaxed in shape.

Replacement of precious metal powder by copper powder for thick film paste hybrid circuit applications is a current trend in the electronic circuit fabrication industry. Copper offers several economic and performance advantages over precious metals. However, copper thick film paste technology is in its infancy, and many improvements still must be made in the process. One of these improvements is enhancing the sintering characteristics of the copper powder.

Cold working the powder before sintering enhances the sinterability of the powder. Strain energy is stored in the powder in the form of dislocation tangles, etc. The energy is released during sintering and allows the use of lower sintering temperatures. Lower sintering temperatures lead to lower furnace energy costs and usually less capital investment in sintering furnaces as well as potential for greater flexibility in the selection of associated thick film paste materials. Typically the powder is ball milled to a fine "flaky" morphology having a diameter to thickness ratio of >about 10, prior to sintering. However, this is not usually desirable for thick film paste feedstock, since an equiaxed geometry is preferred to enhance packing density of the powder.

SUMMARY OF THE INVENTION

In accordance with one aspect of the invention, there is provided copper powder with enhanced sinterability.

In accordance with another aspect of the invention, there is provided a process for producing the powder which comprises fluid energy milling dendritic copper powder particles having a mean particle size of no greater than about 25 micrometers in diameter to produce a deagglomerated cold-worked powder wherein the particles are essentially equiaxed in shape and are of a mean particle size of no greater than about 7 micrometers in diameter.

DETAILED DESCRIPTION OF THE INVENTION

For a better understanding of the present invention, together with other and further objects, advantages and capabilities thereof, reference is made to the following disclosure and appended claims in connection with the above description of some of the aspects of the invention.

The process of this invention results in production of a fine copper powder of essentially equiaxed morphology which has been cold-worked to enhance sinterability. The process includes a fluid energy milling step for inert powder processing to reduce the particle size and to achieve a cold-worked microstructure in the powder.

The starting material can be dendritic copper powder particles having a mean size of no greater than about 25 micrometers in diameter. In this case, the feedstock copper powder is made typically by electrolytic deposition. By "dendritic" is meant fern or tree-like crystals feathery in appearance.

These particles are processed in a fluid energy mill to reduce the particle size and to round the particles by particle-particle collision and shear to an essentially equiaxed morphology. The resulting particles are cold-worked and have a mean particle size of less than about 7 and preferably less than about 5 micrometers in diameter.

The group of processes commonly called "jet milling" or fluid energy milling" include fluidized bed opposed jet milling, the "Coldstream" process in which a stream of gas and the starting material are impinged against a fixed target, etc. All references made herein to "jet milling" or "fluid energy milling" are understood to refer to this group of processes. In the process of the invention, there are no moving parts except for gas compressors to produce the fluid energy stream. Energy is imparted to the particles by the fluid or gas that is, by the velocity of the fluid. All of these processes impart high velocities to the material which is being ground by impacting the accelerated particles against each other or against a solid substrate at a sufficient force to shatter or break the particles into smaller fragments. Many commercial designs of fluid energy mills are currently being sold for continuous size reduction and integral classification. Some designs use supersonic gas nozzles impinging on a dense fluidized bed of powders. Others "sand blast" a stream of powder entrained in gas at a solid target, a loose or fluidized bed of powder, or against an opposing powder/gas stream. The finest particles are typically swept out of the mill, where they are collected by cyclones or filters. Oversize particles remain in the mill for further grinding.

The resulting cold-worked powders of the present invention have a mean particle size of no greater than about 7 micrometers in diameter and preferably no greater than about 5 micrometers in diameter and sinter at lower temperatures than if they were not cold worked.

While there has been shown and described what are at present considered the preferred embodiments of the invention, it will be obvious to those skilled in the art that various changes and modifications may be made therein without departing from the scope of the invention as defined by the appended claims.

What is claimed is:

1. A process for producing copper powder with enhanced sinterability, said process comprising fluid energy milling dendritic copper powder particles having a mean particle size of no greater than about 25 micrometers in diameter to produce a deagglomerated cold-worked powder wherein the particles are essentially equiaxed in shape and are of a mean particle size of no greater than about 7 micrometers in diameter.

2. A process of claim 1 wherein said particle size is no greater than about 5 micrometers in diameter.

* * * * *